US010677756B2

(12) United States Patent
Goldfine et al.

(10) Patent No.: US 10,677,756 B2
(45) Date of Patent: Jun. 9, 2020

(54) INTEGRATED SENSOR CARTRIDGE SYSTEM AND METHOD OF USE (71) Applicant: JENTEK Sensors, Inc., Waltham, MA (US)

(72) Inventors: Neil J Goldfine, Indian Harbour Beach, FL (US); Yanko K Sheiretov, Waltham, MA (US); Scott A Denenberg, Boston, MA (US); Karen Walrath, Waltham, MA (US); Todd M Dunford, Amherst, MA (US); Kevin P Dixon, Boston, MA (US); Christopher T Martin, Concord, MA (US)

(73) Assignee: JENTEK SENSORS, INC., Waltham, MA (US)

( * ) Notice: Subject to any disclaimer, the term of this patent is extended or adjusted under 35 U.S.C. 154(b) by 188 days.

(21) Appl. No.: 15/169,361

(22) Filed: May 31, 2016

(65) Prior Publication Data

US 2016/0349214 A1 Dec. 1, 2016

Related U.S. Application Data (60) Provisional application No. 62/168,443, filed on May 29, 2015.

(51) Int. Cl.
*G01N 27/90* (2006.01)
*G01R 27/26* (2006.01)
*G01R 33/00* (2006.01)

(52) U.S. Cl.
CPC ....... *G01N 27/904* (2013.01); *G01N 27/9006* (2013.01); *G01R 27/2635* (2013.01); *G01R 33/0047* (2013.01); *G01R 33/0094* (2013.01)

(58) Field of Classification Search
CPC ............ G01N 27/904; G01N 27/9006; G01R 27/2635; G01R 33/0047; G01R 33/0094
See application file for complete search history.

(56) References Cited

U.S. PATENT DOCUMENTS

| 4,219,774 A | 8/1980 | Rogel |
| 5,023,549 A | 6/1991 | Dau |

(Continued)

*Primary Examiner* — Christopher P McAndrew
*Assistant Examiner* — Zannatul Ferdous
(74) *Attorney, Agent, or Firm* — Hamilton, Brook, Smith & Reynolds, P.C.

(57) ABSTRACT

A sensor system has an integrated sensor cartridge, and instrument, and an instrument side connector. The integrated sensor cartridge has a mechanical support, a flexible sensor array, and a rigid connector. The mechanical support is shaped to facilitate sensor measurements on a test object. The rigid connector has a mechanical connection and an electrical connection for simultaneous electrical and mechanical mating of the sensor cartridge to the instrument side connector. The flexible array has a connecting portion, a lead portion, and a sensing portion. The sensing portion is attached to the mechanical support, and the connecting portion interfaces with the rigid connector. The connecting portion may form the electrical connection of the rigid connector or may simply mate internally with the electrical connection. The instrument side connector is connected to the instrument which measures the response of the flexible sensor array. Test objects may include bolt holes, fillets, disk slots, and other types of parts or components.

19 Claims, 8 Drawing Sheets (56) References Cited

U.S. PATENT DOCUMENTS

| | | | |
|---|---|---|---|
| 5,059,904 A | 10/1991 | Mazzone | |
| 5,111,142 A | 5/1992 | Mazzone | |
| 5,262,722 A * | 11/1993 | Hedengren | G01N 27/902 324/242 |
| 5,291,136 A | 3/1994 | Van der Veer | |
| 5,327,080 A * | 7/1994 | Haller | G01N 27/902 324/219 |
| 5,442,286 A | 8/1995 | Sutton | |
| 5,801,532 A * | 9/1998 | Patton | G01N 27/902 324/238 |
| 5,903,147 A | 5/1999 | Granger, Jr. | |
| 6,657,429 B1 | 12/2003 | Goldfine | |
| 6,784,662 B2 | 8/2004 | Schlicker | |
| 7,023,205 B1 * | 4/2006 | Krupp | G01N 27/72 324/239 |
| 2003/0071615 A1 * | 4/2003 | Schlicker | G01N 27/82 324/242 |
| 2003/0155914 A1 * | 8/2003 | Tsukernik | G01N 27/82 324/262 |
| 2006/0186880 A1 * | 8/2006 | Schlicker | G01N 27/82 324/242 |
| 2010/0127699 A1 * | 5/2010 | Wang | G01N 27/82 324/238 |

* cited by examiner

INTEGRATED SENSOR CARTRIDGE SYSTEM AND METHOD OF USE

The present application claims priority under 35 U.S.C. § 119(e) to U.S. provisional patent application, U.S. Ser. No. 62/168,443, filed May 29, 2015, which is herein incorporated by reference in its entirety.

The U.S. Government has a paid-up license in this invention and the right in limited circumstances to require the patent owner to license others on reasonable terms as provided for by the terms of contract number FA8117-14-C-0013 awarded by the United States Air Force and by contract number FA8117-12-C-0030 awarded by the United States Air Force.

BACKGROUND

Inspection can reduce maintenance costs and reduce the risk of failure. The use of flexible (conformable) eddy current arrays for inspection has been limited by practical factors such as durability and performance compared to conventional eddy current testing (ET) with single sensing element configurations, and ease-of-use. One ease-of-use limitation is the complexity and requirements for connectors between the array and the instrumentation.

SUMMARY

A sensor system has an integrated sensor cartridge, and instrument, and an instrument side connector. The integrated sensor cartridge has a mechanical support, a flexible sensor array, and a rigid connector. The mechanical support is shaped to facilitate sensor measurements on a test object. The rigid connector has a mechanical connection and an electrical connection for simultaneous electrical and mechanical mating of the sensor cartridge to the instrument side connector. The flexible array has a connecting portion, a lead portion, and a sensing portion. The sensing portion is attached to the mechanical support, and the connecting portion interfaces with the rigid connector. The connecting portion may form the electrical connection of the rigid connector or may simply mate internally with the electrical connection. The instrument side connector is connected to the instrument which measures the response of the flexible sensor array. Test objects may include bolt holes, fillets, disk slots, and other types of parts or components.

Some aspects relate to an integrated sensor cartridge for connecting electrical and mechanical connections simultaneously, the integrated sensor cartridge comprising a mechanical support; a flexible sensor array including a connecting portion, a lead portion, and a sensing portion, the sensing portion attached to the mechanical support; and a rigid connector having a mechanical connection and an electrical connection, and connected to the connecting portion.

In some embodiments, the flexible sensor array is an eddy current array fabricated on a flexible substrate that includes the connecting portion at one end, the lead portion in a middle, and the sensing portion that includes an eddy current sensor construct with a linear drive and a row of sensing elements.

In some embodiments, the flexible sensor array is an eddy current array comprising a drive and a plurality of sensing elements in the sensing portion, and the lead portion has lead traces including drive lead traces for the drive and sensing element lead traces for each of the plurality of sensing elements, the lead traces arranged such that the most proximal lead traces of each of the plurality of sensing elements is another lead trace for the plurality of sensing elements.

In some embodiments, the sensing element leads traces for each of the plurality of sensing channels comprise flux cancellation leads.

In some embodiments, a sheath substantially encloses the lead portion.

In some embodiments, the mechanical support is a mandrel for inspection of bolt holes.

In some embodiments, the flexible sensor array is an eddy current sensor and the sensing portion comprises a linear array of sensing elements and at least one drive element, and an orientation of the linear array is between 30 and 60 degrees from a direction of an axis of the mandrel. In some embodiments, the angle is approximately 45 degrees.

In some embodiments, the mechanical support is in the form of a shuttle shaped to fit the curvature of a part to be inspected. For example, the mechanical support may be in the form of a shuttle shaped to fit an engine disk slot. As another example, the mechanical support may be in the form of a shuttle shaped to fit an engine disk fir tree. The shuttle may include conformable materials so that it can conform to a part to be inspected.

In some embodiments, a foam layer is included between the shuttle and the sensing portion and the shuttle is rigid. The foam layer may have a hardness less than Shore 70 A. The shuttle and the foam layer may be 3D printed in a single process.

In some embodiments an encoder is used to record a relative position of the sensing portion.

Another aspect relates to A sensor system comprising an integrated sensor cartridge having a mechanical support, a flexible sensor array including a connecting portion, a lead portion, and a sensing portion, the sensing portion attached to the mechanical support, and a rigid connector having a mechanical connection and an electrical connection, and connected to the connecting portion; an instrument for measuring a response of the flexible sensor array; and an instrument side connector configured to mate with the rigid connector of the integrated sensor cartridge.

In some embodiments, the mechanical support comprises a joint that locks into at least two different positions. The two different positions may be two different angles relative to an axis of the sensor system.

In some embodiments, the mechanical connection of the rigid connector comprises a ring with a thread that threads into the instrument side connector.

In some embodiments the system has a robotic arm, wherein the instrument side connector is located at a distal end of the robotic arm. The integrated sensor cartridge may be among a plurality of integrated sensor cartridges and the robotic arm is configured to engage and disengage the rigid connector of any of the plurality of integrated sensor cartridges.

In some embodiments, the mechanical support is a mandrel and the sensing portion of the flexible sensor is attached thereto.

In some embodiments, the instrument comprises a cylindrical coordinate model for processing the measurement of the flexible sensor and determining a condition of an inspected material under test.

In some embodiments, the instrument side connector is configured to spin such that when mated to the integrated sensor cartridge the mandrel spins about its axis. In some embodiments, a gain stage of the instrument is rigid with the instrument side connector.

Yet another aspect relates to a method of inspecting a material under test (MUT), the method comprising engaging an instrument side connector with an integrated sensor cartridge having a mechanical support, a flexible sensor array, and a rigid connector having a mechanical connection and an electrical connection, wherein the flexible sensor array includes a connecting portion, a lead portion, and a sensing portion, the sensing portion attached to the mechanical support; placing the sensing portion of the flexible sensor array proximal to the MUT; and interrogating the flexible sensor array with an instrument.

In some embodiments, the flexible sensor array is a segmented field array. The segmented field array may be an eddy current array having at least one drive and at least two inductive sensing elements. The segmented field array may be a dielectrometer having at least one drive electrode and at least two sensing electrodes. The segmented field array has a circular drive and at least two sensing element arcs at at least two radial distances from the circular drive.

The MUT may have a coating, and the method may further process data collected by the interrogating step to estimate a thickness of the coating.

In some embodiments the flexible sensor array is an eddy current sensor having at least one drive and at least two inductive sensing elements.

In some embodiments, the surface of the MUT is a cylindrical hole, the mechanical support is a mandrel and the placing comprises inserting the mandrel into the cylindrical hole.

In some embodiments, the surface of the MUT is a fillet, and the mechanical support is shaped to include a conforming region that conforms with the fillet, the sensing portion is attached to the conforming region, and the placing comprises moving the conforming region along to the fillet.

In some embodiments the engaging comprises maneuvering the instrument side connector through a robotic arm to which is has been connected to a distal end of, to engage the rigid connector of the integrated sensor cartridge, and the placing comprises maneuvering the robotic arm to place the sensing portion of the flexible sensor array proximal to the MUT.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized the need for rapidly adapting flexible sensors to conform with bolt holes, fillets, and other features of components, parts, and other such test objects. An integrated sensor cartridge is disclosed that allows for simultaneous mechanical and electrical connection to a measurement instrument.

Figure 1:
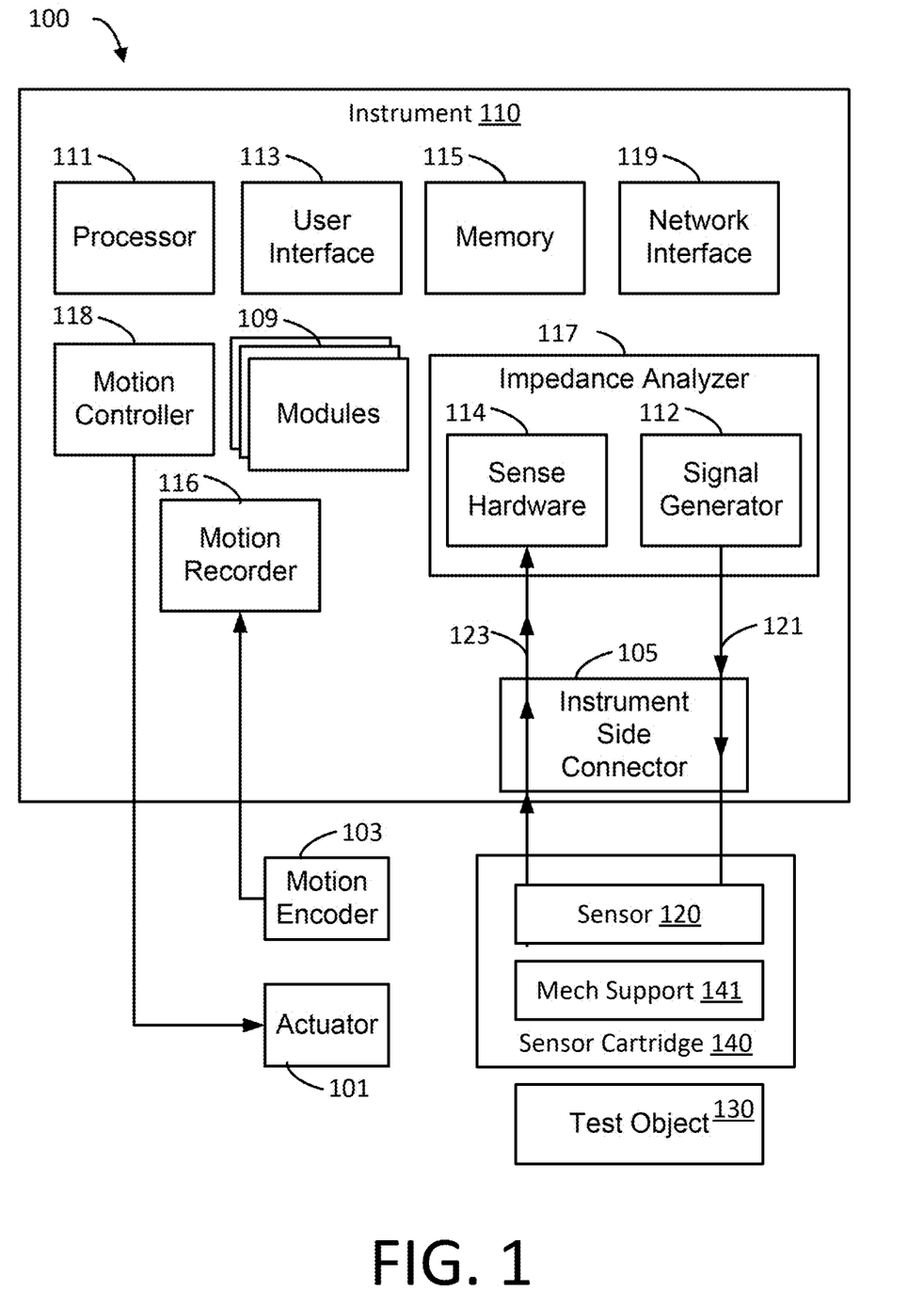
FIG. 1 is a block diagram of a system for inspecting a test object, according to some embodiments.

FIG. 1 is a block diagram of a system 100 for inspecting a test object 130. System 100 includes an instrument 110 and a sensor cartridge 140. Sensor cartridge 140 has a rigid connector which interfaces both mechanically and electrically with an instrument side connector 105. Advantageously both the electrical and mechanical connections of sensor cartridge 140 engage simultaneously with connector 105. Sensor cartridge 140 also includes a flexible sensor 120, and a mechanical support 141 to which the sensor is attached. Instrument 110 is configured to provide excitation signals 121 to sensor 120 and measure the resulting response signals 123 of sensor 120. Response signals 123 may be measured and processed to estimate properties of interest, such as electromagnetic properties (e.g., conductivity, permeability, and permittivity), geometric properties (e.g., thickness, sensor lift-off), material condition (e.g., fault/no fault, crack size, corrosion depth, stress level, temperature), or any other suitable property or combination thereof. (Sensor lift-off is a distance between the sensor and the closest surface of the test object for which the sensor is sensitive to the test object's electrical properties.)

Instrument 110 may include a processor 111, a user interface 113, memory 115, an impedance analyzer 117, and a network interface 119. Though, in some embodiments of instrument 110 may include other combinations of components. While instrument 110 is drawn as a single block, it should be appreciated that instrument 110 may be physically realized as a single "box"; multiple, operably-connected "boxes", or in any other suitable way. For example, in some embodiments it may be desired to provide certain components of instrument 110 as proximal to sensor 120 as practical, while other components of instrument 110 may be located at greater distance from sensor 120.

Processor 111 may be configured to control instrument 110 and may be operatively connected to memory 115. Processor 111 may be any suitable processing device such as for example and not limitation, a central processing unit (CPU), digital signal processor (DSP), controller, addressable controller, general or special purpose microprocessor, microcontroller, addressable microprocessor, programmable processor, programmable controller, dedicated processor, dedicated controller, or any suitable processing device. In some embodiments, processor 111 comprises one or more processors, for example, processor 111 may have multiple cores and/or be comprised of multiple microchips.

Memory 115 may be integrated into processor 111 and/or may include "off-chip" memory that may be accessible to processor 111, for example, via a memory bus (not shown). Memory 115 may store software modules that when executed by processor 111 perform desired functions. Memory 115 may be any suitable type of non-transient computer-readable storage medium such as, for example and not limitation, RAM, a nanotechnology-based memory, one or more floppy disks, compact disks, optical disks, volatile and non-volatile memory devices, magnetic tapes, flash memories, hard disk drive, circuit configurations in Field Programmable Gate Arrays (FPGA), or other semiconductor devices, or other tangible, non-transient computer storage medium.

Instrument 110 may have one or more functional modules 109. Modules 109 may operate to perform specific functions such as processing and analyzing data. Modules 109 may be implemented in hardware, software, or any suitable combination thereof. Memory 115 of instrument 110 may store computer-executable software modules that contain computer-executable instructions. For example, one or more of modules 109 may be stored as computer-executable code in memory 115. These modules may be read for execution by processor 111. Though, this is just an illustrative embodiment and other storage locations and execution means are possible.

Instrument 110 provides excitation signals for sensor 120 and measures the response signal from sensor 120 using impedance analyzer 117. Impedance analyzer 117 may contain a signal generator 112 for providing the excitation signal to sensor 120. Signal generator 112 may provide a suitable voltage and/or current waveform for driving sensor 120. For example, signal generator 112 may provide a sinusoidal signal at one or more selected frequencies, a pulse, a ramp, or any other suitable waveform.

Sense hardware 114 may comprise multiple sensing channels for processing multiple sensing element responses in parallel. Though, other configurations may be used. For example, sense hardware 114 may comprise multiplexing hardware to facilitate serial processing of the response of multiple sensing elements. Sense hardware 114 may measure sensor transimpedance for one or more excitation signals at on one or more sense elements of sensor 120. It should be appreciated that while transimpedance (sometimes referred to simply as impedance), may be referred to as the sensor response, the way the sensor response is represented is not critical and any suitable representation may be used. In some embodiments, the output of sense hardware 114 is stored along with temporal information (e.g., a time stamp) to allow for later temporal correlation of the data.

Sensor 120 may be an eddy-current sensor, a dielectrometry sensor, an ultrasonic sensor, or utilize any other suitable sensing technology or combination of sensing technologies. In some embodiments, sensor 120 is an eddy-current sensor such as an MWM®, MWM-Rosette, or MWM-Array sensor available from JENTEK Sensors, Inc., Waltham, Mass. Sensor 120 may be a magnetic field sensor or sensor array such as a magnetoresistive sensor (e.g., MR-MWM-Array sensor available from JENTEK Sensors, Inc.), a segmented field MWM sensor, hall effect sensors, and the like. In another embodiment, sensor 120 is an interdigitated dielectrometry sensor or a segmented field dielectrometry sensor such as the IDED® sensors also available from JENTEK Sensors, Inc. Segmented field sensors have sensing elements at different distances from the drive winding or electrode to enable interrogation of a material to different depths at the same drive input frequency. Sensor 120 may have a single or multiple sensing and drive elements. Sensor 120 may be scanned across, mounted on, or embedded into test object 130.

In some embodiments, the computer-executable software modules may include a sensor data processing module, that when executed, estimates properties of the component under test. The sensor data processing module may utilize multi-dimensional precomputed databases that relate one or more frequency transimpedance measurements to properties of test object 130 to be estimated. The sensor data processing module may take the precomputed database and sensor data and, using a multivariate inverse method, estimate material properties. Though, the material properties may be estimated using any other analytical model, empirical model, database, look-up table, or other suitable technique or combination of techniques.

User interface 113 may include devices for interacting with a user. These devices may include, by way of example and not limitation, keypad, pointing device, camera, display, touch screen, audio input and audio output.

Network interface 119 may be any suitable combination of hardware and software configured to communicate over a network. For example, network interface 119 may be implemented as a network interface driver and a network interface card (NIC). The network interface driver may be configured to receive instructions from other components of instrument 110 to perform operations with the NIC. The NIC provides a wired and/or wireless connection to the network. The NIC is configured to generate and receive signals for communication over network. In some embodiments, instrument 110 is distributed among a plurality of networked computing devices. Each computing device may have a network interface for communicating with other the other computing devices forming instrument 110.

In some embodiments, multiple instruments 110 are used together as part of system 100. Such systems may communicate via their respective network interfaces. In some embodiments, some components are shared among the instruments. For example, a single computer may be used control all instruments. In one such embodiment multiple features, such as bolt holes or disk slots, are inspected simultaneously or in an otherwise coordinated fashion to using multiple instruments and multiple sensor arrays with multiple integrated connectors to inspect a component faster or more conveniently.

Actuator 101 may be used to position sensor cartridge 140 with respect to test object 130 and ensure suitable conformance of sensor 120 with test object 130. Actuator 101 may be an electric motor, pneumatic cylinder, hydraulic cylinder, or any other suitable type or combination of types of actuators for facilitating movement of sensor cartridge 140 with respect to test object 130. Sensor cartridge 140 may be positioned manually in some embodiments, while still other embodiments a combination of actuators and manual positioning may be used. For scanning applications where sensor 120 moves relative to test object 130, it is not critical whether sensor 120 or test object 130 is moved, or if both are moved to achieve the desired scan. Scanning may be performed in a contact or noncontact manner. For contact sensors, one embodiment includes a plastic shuttle or metal shuttle that is shaped similarly to the surface being inspected, with a flexible layer such as foam which is attached to the shuttle with an adhesive or other means, and with the sensor mounted to the foam. In some applications the foam or flexible layer is not included and the sensor is mounted directly to the plastic or other material shuttle.

Actuators 141 may be controlled by motion controller 118. Motion controller 118 may control sensor cartridge 140 to move sensor 120 relative to test object 130 during an inspection procedure. In one embodiment, a flexible lead is used to coil on a shaft to enable rotation of a sensor within a hole. In one such embodiment a gain stage of the electronics are located on a rotating mechanism that rotates with the sensor to improve performance. In another embodiment the entire instrument is rotated with sensor cartridge 140.

Regardless of whether motion is controlled by motion controller 118 or directly by the operator, position encoders 143 of fixture 140 and motion recorder 116 may be used to record the relative positions of sensor 120 and test object 130. This position information may be recorded with impedance measurements obtained by impedance instrument 117 so that the impedance data may be spatially registered.

Figure 2:
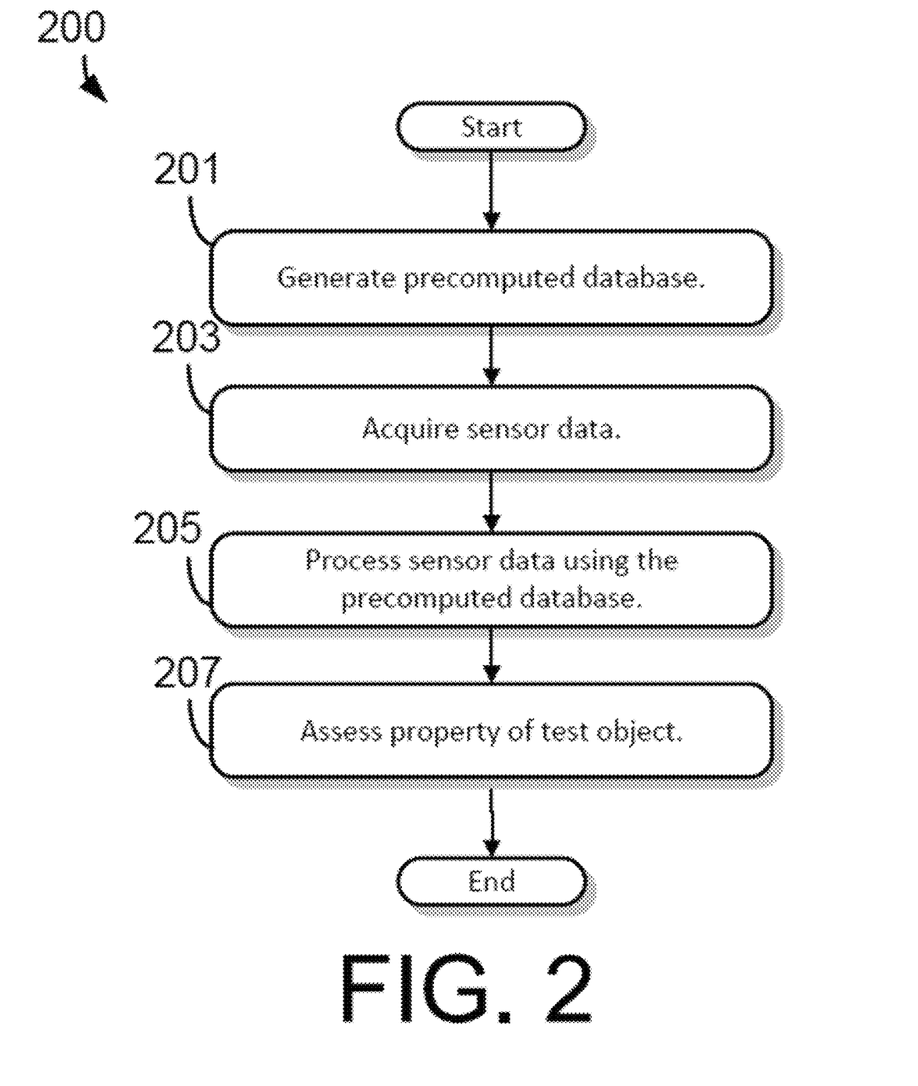
FIG. 2 is a flow diagram of a method for assessing a property of a test object, according to some embodiments.

System 100 may be used to perform a method 200 for assessing a property of a test object, shown in FIG. 2.

At step 201 a precomputed database of sensor response signals is generated. The response signals generated may be predictions of the response signal 123 in FIG. 1 for a given excitation signal 121, sensor 120 and test object 103. Response signals may be generated for a variety of excitation signals, sensors/sense elements, and test objects, including variation in the position and orientation of the sensor and test objet. For example, the precomputed database may be generated for multiple excitation frequencies, multiple sensor geometries, multiple lift-offs, and multiple test object properties (e.g., geometric variations, electromagnetic property variations). The precomputed database may be generated using a model of the system, empirical data, or in any suitable way. In some embodiments the model is an analytical model, a semi-analytical model, or a numeric (e.g., finite element) model.

At step 203, sensor data is acquired. The sensor data may be acquired, for example, using instrument 110. Sensor data may be a recorded representation of the response signal 123, excitation signal 121, or some combination of the two (e.g., impedance). In some embodiments, sensor data is acquired at a plurality of excitation frequencies, multiple sensors (or sensing elements), and/or multiple sensor/test object positions/orientations (e.g., as would be the case during scanning).

At step 205, the sensor data is processed using the precomputed database generated at step 201. A multivariate inverse method may be used to process the sensor data with the At step 207, a property of the test object is assessed based on the processing of the measurement data at step 205. The property assessed may be an electromagnetic property, geometric property, state, conditions, or any other suitable type of property. Specific properties include, for example and not limitation, electrical conductivity, magnetic permeability, electrical permittivity, layer thickness, stress, temperature, damage, age, health, density, viscosity, cure state, embrittlement, wetness, and contamination. Step 207 may include a decision making where the estimated data is used to choose between a set of discrete outcomes. Examples include pass/fail decisions on the quality of a component, or the presence of flaws. Another example it may be determined whether the test object may be returned to service, repaired, replaced, scheduled for more or less frequent inspection, and the like. This may be implemented as a simple threshold applied to a particular estimated property, or as a more complex algorithm.

By performing step 201 prior to step 205 it may be possible that steps 203, 205 and 207 may be performed in real-time or near-real-time. Though, in some embodiments, step 201 may be performed after step 203 such as may be the case when database generation was not possible prior to the acquisition of measurement data, and perhaps further exacerbated by the fact that the test object may be no longer available for measurement.

Having described method 200 it should be appreciated that in some embodiments the order of the steps of method 200 may be varied, not all steps illustrated in FIG. 2 are performed, additional steps are performed, or method 200 is performed as some combination of the above. While method 200 was described in connection with system 100 shown in FIG. 1, it should be appreciated that method 200 may be performed with any suitable system.

Figure 3:
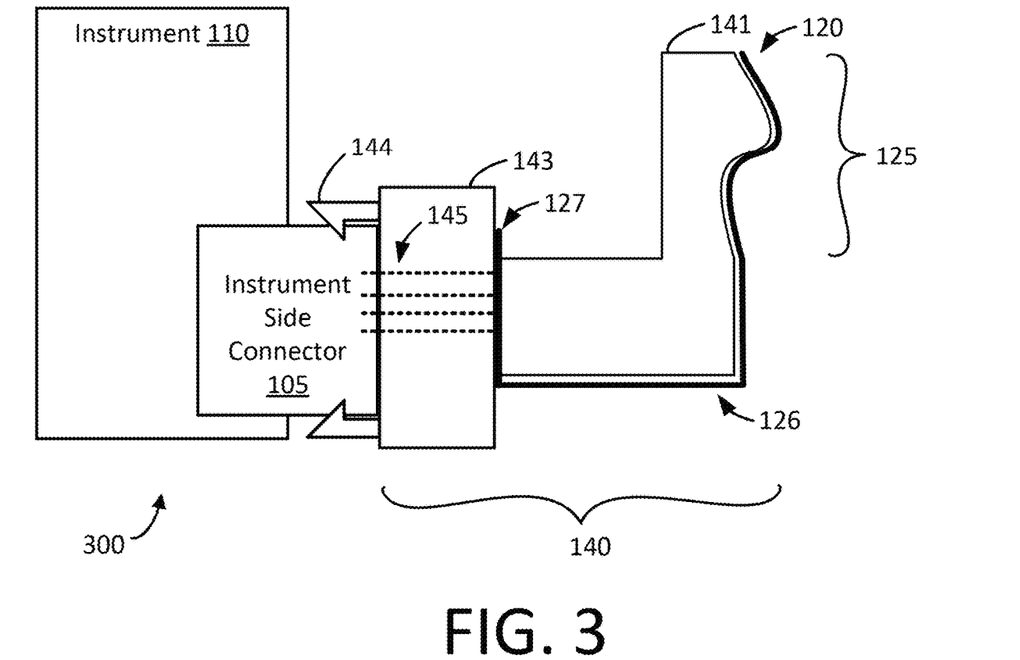
FIG. 3 is a system having an integrated sensor cartridge, according to some embodiments.

FIG. 3 shows system 300 where instrument 110 has an instrument side connector 105, which is connected to rigid connector 143 of sensor cartridge 140. Rigid connector 143 incorporates mechanical connection 144 and electrical connection 145. In addition to rigid connector 143, sensor cartridge 140 includes a flexible sensor array 120 and a mechanical support 141. Flexible sensor array 120 includes a connecting portion 127, a lead portion 126, and a sensing portion 125. Connecting portion 127 is connected to rigid connector 143 such that the leads of flexible sensor array 120 are electrically connected to electrical connection 145. Mechanical support 141 serves to hold sensing portion 125 of flexible sensor array 120 in a shape or position that is suitable for a specific sensing task.

The mechanical connection 144 provides an attachment between the mechanical support 141 and the instrument side connector 105. The attachment can be implemented by way of screws, clips, or in any other suitable way. Electrical connection 145 provides the electrical interface between the connecting portion 127 of the flexible sensor array 120 and the instrument side connector 105. These connections may include connections for one or more drive elements, sensing elements, ground elements, and the like.

Electrical connection 145 may also support electrical connections in addition to those used to interface with flexible sensor array 120. Such additional electrical connections may be used, for example, to power and operate motors or other electrical actuators in sensor cartridge 140.

Sensing portion 125 of flexible sensor array 120 contains the active area of the sensor. Sensing portion 125 may include drive elements and an array of sensing elements in a suitable configuration. For example, where flexible sensor array 120 is an eddy current sensor the drive element and sense elements may be appropriately configured windings. As another example, where flexible sensor array 120 is a dielectrometer, the drive element and sense elements may be appropriately configured electrodes. The array of elements may have a linear, radial, circumferential, or any other suitable configuration. Each element of the array need not be identical and may be of different types (e.g., inductive, magnetoresistive), though, in some embodiments, all elements of the array are substantially identical.

Sensing portion 125 may be secured to mechanical support 141 using an adhesive, pins, screws, or any other suitable securing mechanism or combination thereof.

Lead portion 126 consist of a series of conductors, such as lead traces, that connect the elements of sensing portion 125 to the connecting portion 127. In some embodiments, performance of flexible sensor array 120 is improved by reducing undesired coupling between elements, particularly between drive element(s) and sensing elements. Accordingly, the lead traces for the drive windings may be spatially separated from the lead traces for the sensing elements to the extent practical. Said another way, the lead traces for each sensing element are arranged such that the most proximal set of lead traces to it are for another sensing element and not for a drive element.

In some embodiments, the lead traces of lead portion 126 includes "flux cancellation leads" as described, for example, in U.S. Pat. Nos. 6,657,429 and 6,784,662, which are herein incorporated by reference in their entirety. Flux cancellation leads are used to reduce coupling of stray inductive and capacitive coupling, thus improving sensor performance.

Connecting portion 127 provides an interface for electrically connecting to flexible sensor array 120. In some embodiments, rigid connector 143 is configured to secure connecting portion 127 in a position so that the connector of connecting portion 127 is used as electrical connection 145. That is, electrical connection 145 of rigid connector 143 may be entirely achieved by securing connecting portion 127 of flexible sensor array 120 to rigid connector 143. In some other embodiments, electrical connection 145 is distinct hardware that interfaces with connecting portion 127. That is, connecting portion 127 may plug into electrical connection 145 (which in turn plugs into instrument side connector 105). In another embodiment, electrical connection 145 comprises both the connecting portion 127 and additional electrical connections needed to support electrical features of sensor cartridge 140 that are in addition to flexible sensor array 120, such as electrical actuators built into sensor cartridge 140. Electrical connection 145, may thus be implemented through connecting portion 127, through separate hardware (that interfaces with connecting portion 127), through a combination of both connecting portion 127 and separate hardware, or in any other suitable way.

Figure 8:
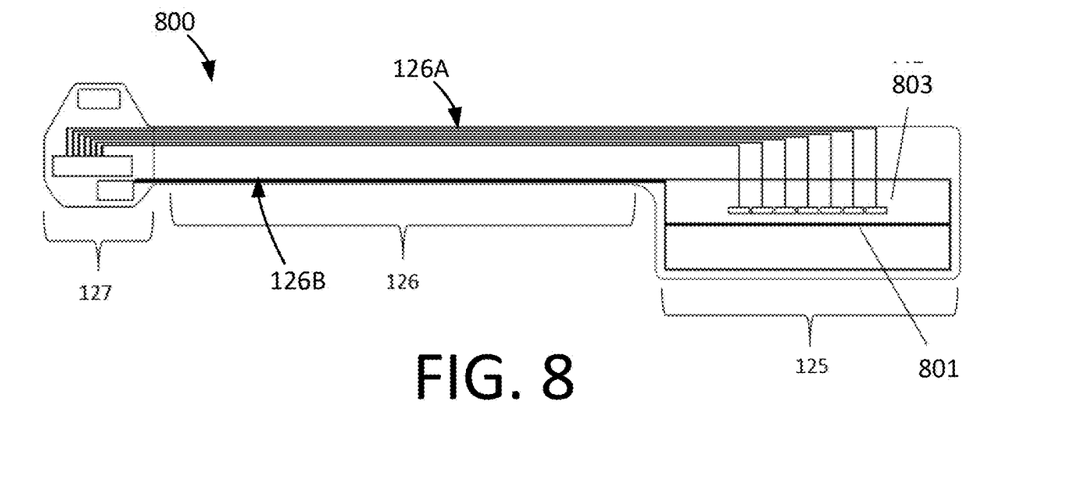
FIG. 8 is an eddy current sensor array, according to some embodiments.

FIG. 8 shows an embodiment of an eddy current sensor 800 constructed on a flexible printed circuit board. Lead portion 126 of sensor 800 is integral to a flexible eddy current array sensor on a flexible printed circuit. In this embodiment, drive lead traces 126B for linear drive coil 801 are separated from the lead traces 126A for the linear array of sense elements 803. Connecting portion 127 consists of electrical connections that serve as an electrical interface between the lead portion 126 and the instrument side connector 105.

Instrument side connector 105 mates electrically and mechanically with sensor cartridge 140. It has the complementary features necessary to mate both mechanically and electrically with sensor cartridge 140. It should be appreciated that the mechanical and electrical connectors described as part of the instrument side connector or as part of the sensor cartridge may be interchanged in some embodiments. That is, if a male portion is described as being part of the sensor cartridge and a female portion is described as being part of the instrument side connector, the configuration may be switched (i.e., the male portion being part of the instrument side connector and the female portion as part of the sensor cartridge). Likewise, if a female portion is described as being part of the sensor cartridge and a male portion is described as being part of the instrument side connector, the configuration may also be switched.

Figure 4:
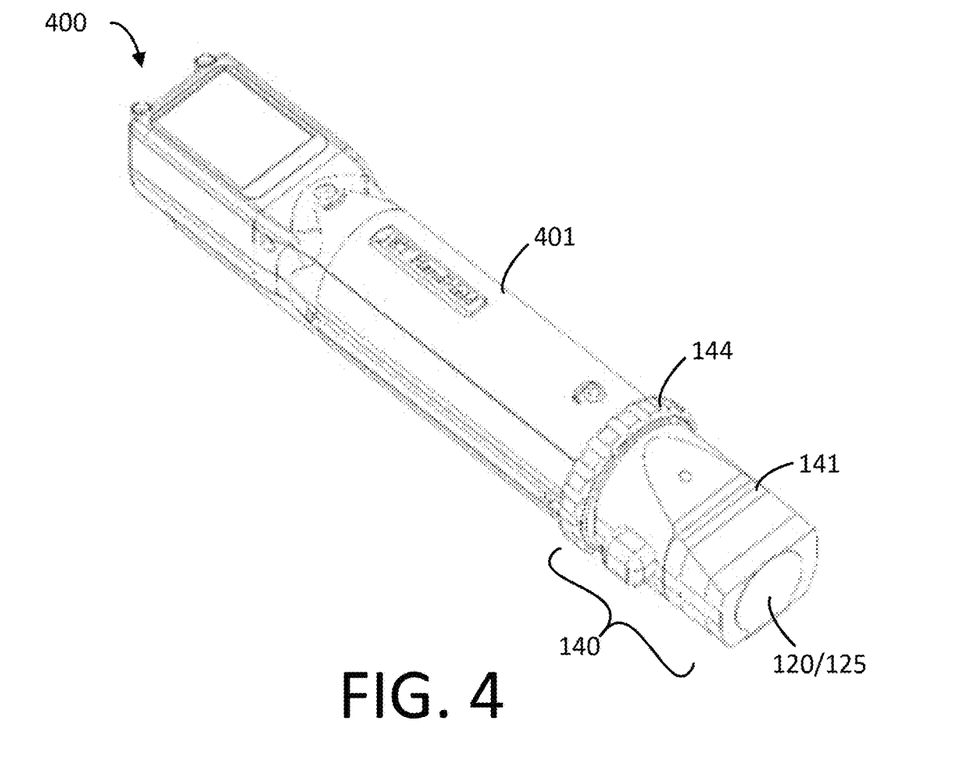
FIG. 4 is a handheld system having an integrated sensor cartridge, according to some embodiments.

FIG. 4 shows an embodiment as a handheld system 400 setup with an embodiment of sensor cartridge 140 adapted for point measurement. Sensor cartridge 140 is connected to handheld instrument 401 with mechanical connection 144. The instrument side connector is obscured from view due to the connection. Mechanical support 141 supports flexible sensor array 120 (of which only sensing portion 125 is visible). It should be appreciated that the handheld instrument 401 may not include all components of instrument 110. For example, in some embodiments, an external computer connects to handheld instrument 401 to provide additional functionality not supported by handheld instrument 401.

Mechanical support 141 may be shaped to fit the curvature of a test object to be inspected. In the example embodiment of system 400, mechanical support 141 is flat but made of a compliant material such that sensing portion 125 can conform to a variety of test objects. In other embodiments, mechanical support 141 may be shaped as a mandrel to fit within a bolt hole (e.g., cylindrical), shaped to fit an engine disk slot, or shaped to fit an engine disk fir tree.

In some embodiments mechanical support 141 may use compressible materials to facilitate conformance between sensing portion 125 and the test object. Where test objects of different shapes are to be tested with a single sensor cartridge, conformance will be particularly important. The thickness, shape and hardness of the compressible materials may be selected to provide satisfactory sensor performance for anticipated circumstances as practical. In some embodiments the conformable material (such as foam) may have a hardness less than Shore 70 A, though any suitable conformable material hardness may be used.

In some embodiments mechanical support 141 incorporates actuators such as motors or pneumatic devices to provide additional motion of the sensor. Rigid connector 143 and instrument side connector 105 may be configured to support the additional connections needed to support such actuators through electrical connector 145, mechanical connector 144, and any suitable additional connectors. Such additional connectors may support, for example, pneumatic or hydraulic connections.

Figure 5A:
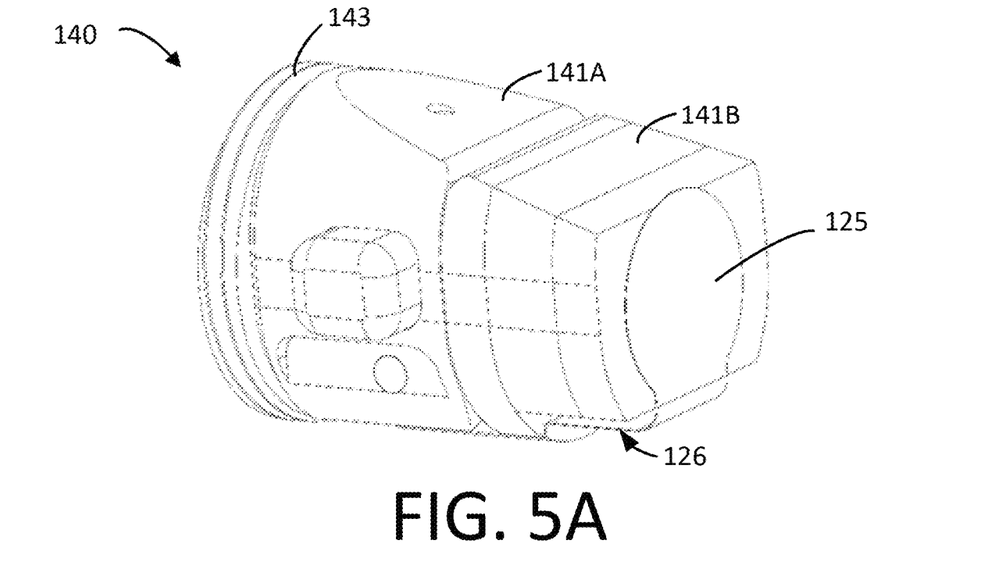
FIGS. 5A and 5B are detailed views of the integrated sensor cartridge showing the mechanical support in two different positions, in accordance with some embodiments.
Figure 5B:
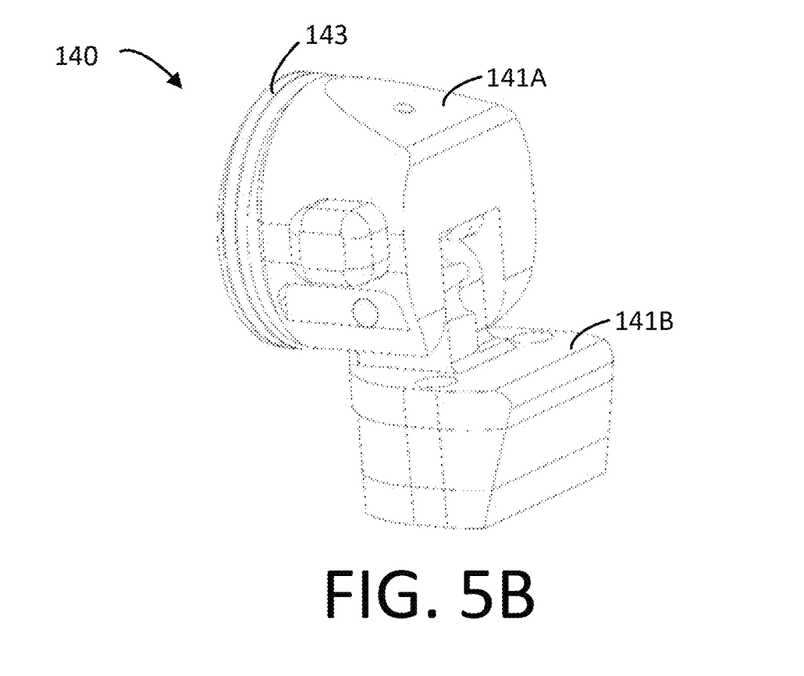

In some embodiments, mechanical support 141 may include articulating elements that allow the flexible sensor array 120 to be held in multiple positions using the same mechanical support 141. FIG. 5A and FIG. 5B show a detail of the embodiment of sensor cartridge 140 shown in connection with system 400. Here mechanical support 141 of sensor cartridge 140 includes a joint that allows it to rotate such that sensing portion 125 of flexible sensor array 120 may be held in a different position relative to the rigid connector 143. Specifically mechanical support 141 has a top portion 141A and a bottom portion 141B connected together by a joint visible in the rotated position shown in FIG. 5B. While this example embodiment shows two positions with rotation about a single joint, it should be appreciated that some embodiments will include multiple positions or multiple articulating elements.

Figure 5C:
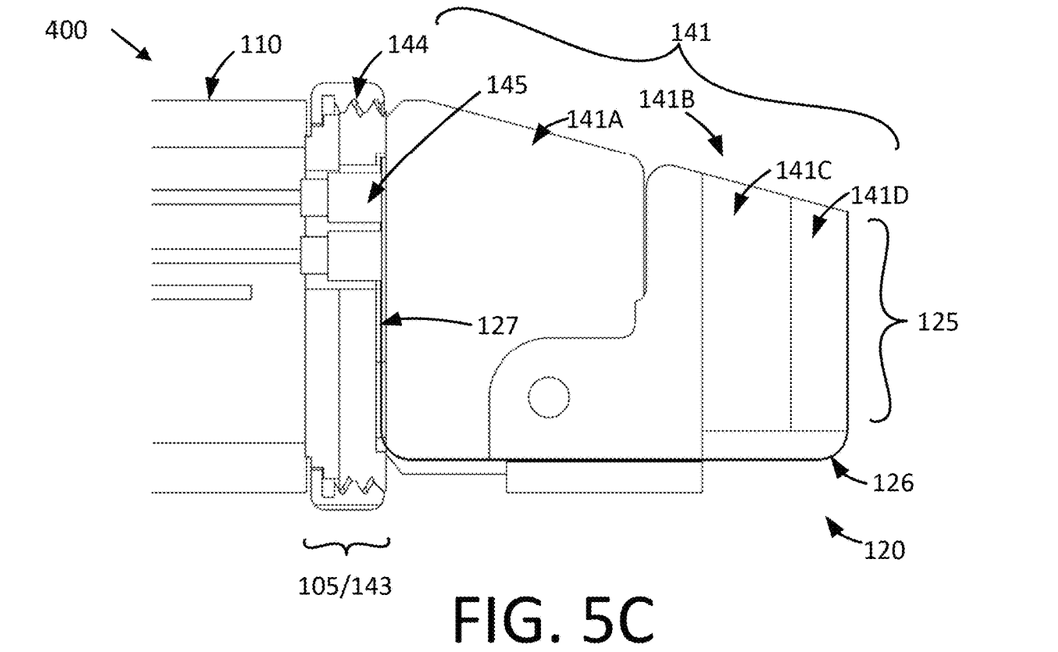
FIG. 5C is a detailed view of the interface between the sensor cartridge and the instrument side connector, according to some embodiments.

FIG. 5C shows a detail of system 400 with a cross-section of the connection interface between instrument side connector 105 and rigid connector 143. In order to form the connection, instrument side connector 105 and rigid connector 143 are first aligned with one another. Alignment pins, groves, or any other suitable alignment feature may be used to facilitate alignment of the mating components. Mechanical connection 144 is a threaded ring that threads into instrument side connector 105. The threaded ring may spin freely relative to the rest of sensor cartridge 140 and have a shelf portion that so that the force applied to the rest of sensor cartridge 140 is normal to the mating surface of the electrical connections. Although the threaded ring is shown as part of mechanical connection 144, it should be appreciated that in some embodiments instrument side connector 105 comprises the threaded ring while mechanical connection 144 of rigid connector 143 comprise a fixed threaded portion.

Further details of mechanical support 141 for system 400 are also provided in FIG. 5C. Specifically, bottom portion 141B includes a firm foam portion 141C and a soft foam portion 141D. Foam portions 141C and 141D are selected to have a thickness and hardness suitable for the target application of the system.

Figure 6:
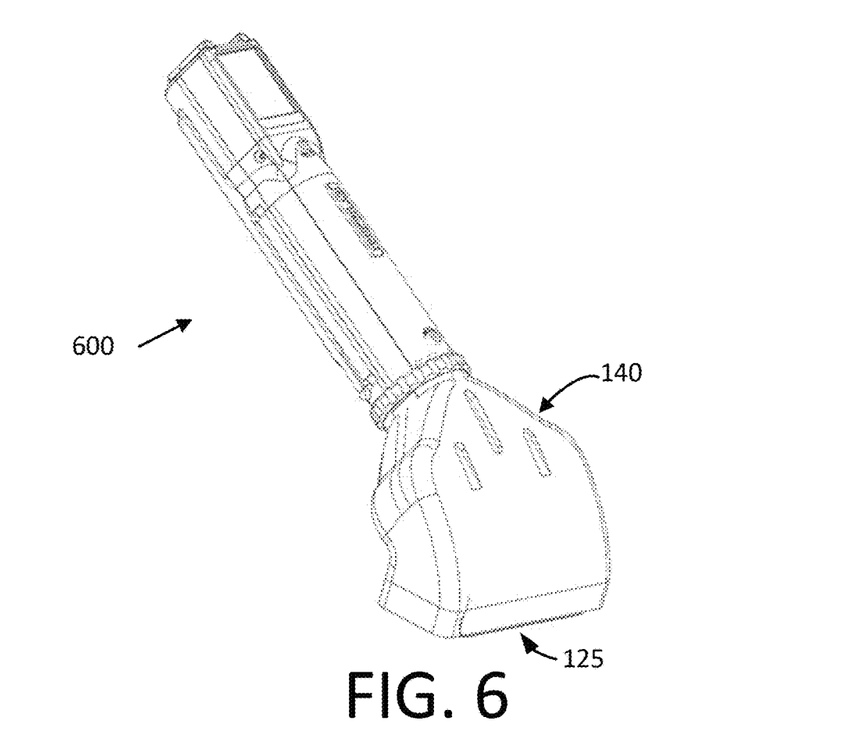
FIG. 6 is a handheld system having an integrated sensor cartridge, according to some embodiments.

FIG. 6 shows system 600. System 600 may use the same instrument 110 as system 400 but has a different sensor cartridge 140. Sensor cartridge 140 of system 600 may be configured such that sensing portion 125 has a linear array of sensing elements located on the distal end of sensor cartridge 140.

Figure 7A:
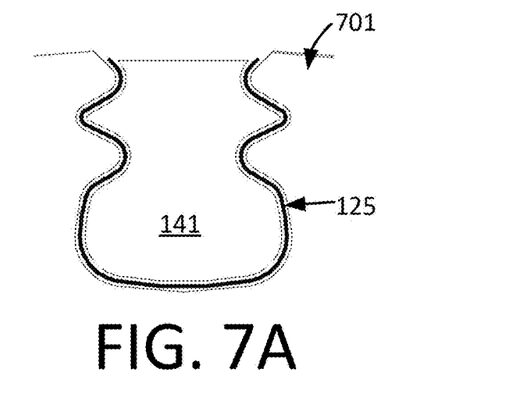
FIG. 7A is a portion of a detailed portion of a sensor cartridge for engine disk slot inspection, according to some embodiments.

FIG. 7A shows an embodiment where sensing portion 125 is held in place by a mechanical support 141 shaped to fit an engine disk slot 701. Flexible sensor array 120 is wrapped around the perimeter of mechanical support 141 so that it can be held in close proximity to the interior of the engine disk slot or engine disk fir tree. Here sensing portion 125 and mechanical support 141 are shown within engine disk slot 701 as would be the case during interrogation of the sensor. (Other portions of sensor cartridge 140 and the system are not shown for simplicity.)

Figure 7B:
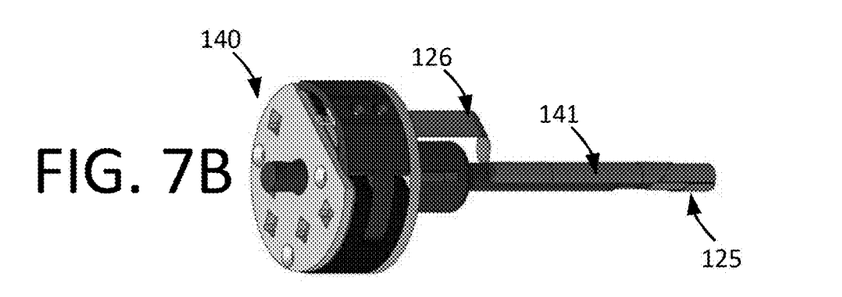
FIGS. 7B and 7C are perspective views of an integrated mandrel sensor cartridge, according to some embodiments.
Figure 7C:
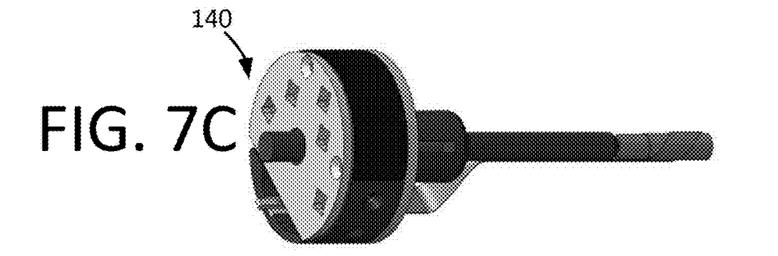

Bolt holes in aerospace and other fields, may require inspection to determine if the hole has fatigue or other forms of damage. FIGS. 7B and 7C show two perspective views of a sensor cartridge 140 configured as a mandrel. Such a mandrel may be used for inspection of bolt holes and the like. Sensing portion 125 may be secured to the distal end of the mandrel.

In some embodiments, system 100 is configured as a scanner that uses the mandrel sensor cartridge 140 (such as shown in FIGS. 7B and 7C) to inspect bolt holes, bolt holes with nut plates, deep bolt holes (large length/diameter), bolt holes with bushings, and the like. The scanner may have a handheld portion to which a mandrel is connected. This handheld portion may incorporate some or all the desired components of instrument 110. For example, an external computer may be connected to the handheld portion to provide additional desired components. The handheld portion may be configured to rotate the sensor cartridge (e.g., the integrated mandrel) and vary its axial position.

Figure 11:
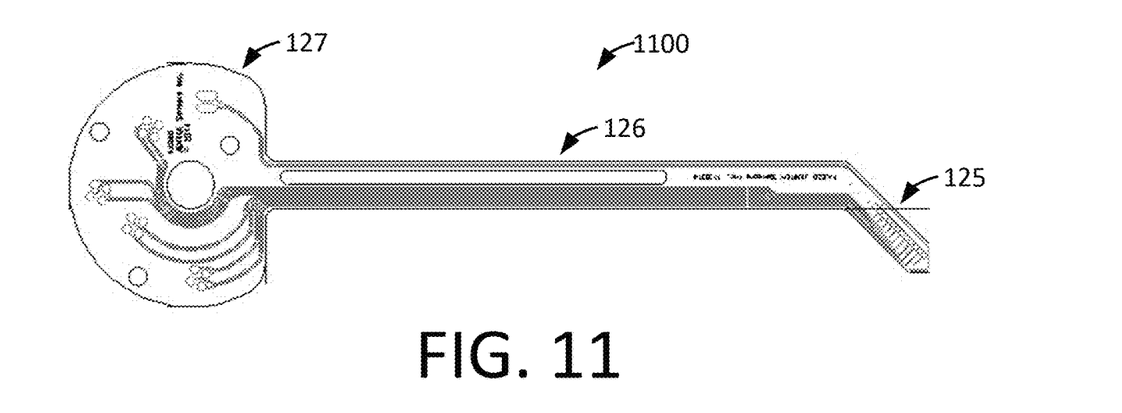
FIG. 11 is a 7 channel, linear array eddy current sensor adapted for use as part of an integrated mandrel.

An integrated mandrel with an eddy current based sensor may be used. For example, a linear drive eddy current array, such as sensor 1100 shown in FIG. 11 may be used. Notably sensor 1100 has a linear drive construct and a plurality of sensing elements arranged in an array configuration. The active sensing area is simply the distal end at the far right of the sensor. The remainder of the sensor is the leads and the connector portion. In the embodiment shown, the sensor consist of 7 sensing elements and 1 drive winding.

As mentioned above the sensor may be attached to a mechanical mandrel; the mandrel thus being attached to the scanner. This integrated mandrel may be interchangeable so that different applications may be addressed with the same scanner. For example, different mandrels may be designed to accommodate different bolt hole dimensions (length/diameter), the presence of a bushing or nut plate, or any of various scenarios where variations on the sensor and mandrel configuration is beneficial to the inspection application. The mandrel may include features that allow it to press the sensor against the inside surface of the bolt hole. The mandrel may include a balloon portion that can be inflated (using gas or liquid) to apply pressure against the sensor to the bolt hole. Another example mechanism is a mechanical wedge. Though any suitable expansion mechanism may be used, if desired.

In some embodiments, a spring loaded inflation mechanism (including lock-out mechanism) for balloon-actuated mandrel functionality is used. In such cases, the main cylindrical body contains a chamber which is connected directly to a balloon at the tip of the mandrel and which may contain air or liquid. This chamber may be sized such that it may be inserted into the hole during inspection to reduce tool size for long length holes. Into the top of the mandrel, a piston may be inserted to force the air or liquid into the balloon. This piston may be actuated by use of a spring to maintain constant pressure during operation. The piston may have a mechanism to lock it into the deflated position for handling and storage between uses.

An image of an integrated mandrel is shown in FIGS. 7A and 7B. The electrical and mechanical connections of the mandrel may be integrated so that a single effort of the user connects both the electrical and mechanical aspects of the integrated mandrel to the scanner.

The electrical connections of the sensor connect to electronics within the scanner. The scanner electronics function to support the measurement. Functions may include amplification of the drive winding current, measurement of the drive current, amplification and/or filtering of the sense element responses. Though, other electrical functions may also be served. At least a portion of the electronics are included in a portion fixed to the mandrel. As these electronics are fixed to the integrated mandrel, and rotation of the integrated mandrel or variation in the axial position within the hole will not only move the sensor but also this portion of the electronics. This portion of the electronics is herein referred to as the rotating portion. The remaining portion of the electronics (if any) is the "stationary portion".

The rotating portion of the electronics is connected to the station portion of the electronics through a suitable interface. In some embodiments a slip ring connection is used. In another embodiment a connection tape is used. The connection tape consists of electrical leads necessary for communication between the two portions of the electronics. The tape is connected to the rotating electronics at one end and to the stationary electronics at the other. These connections may be indirect as additional leads may be permitted at both ends. The tape may be configured to spool during rotation of the sensor/mandrel and the rotating electronics. Additional they tape may be configured to shift axially as the sensor/mandrel and the rotating electronics move axially.

In some embodiments both the connecting tape and the slip ring are used to make electrical connections. For example, power connections may be made through a slip ring while signals are provided through the connection tape. Though, other configurations may be used.

In some embodiments, the scanner is configured with all measurement electronics within the rotating portion. The output of the measurement electronics which may include the measurement data, sensor position data, and the like, may be output through a slip ring, connection tape as described above, or in any suitable way.

The scanner includes motors or other suitable mechanisms for actuating the pressure mechanism of the integrated mandrel.

It should be appreciated that the scanner may be formatted as a handheld device or in other configurations. For example, they scanner may be in the form of a press (similar to a drill press). As another example, a plurality of scanners may be used together to inspect more than one bolt hole at the same time. This configuration may be ideal for use with engine component inspection where such inspection needs are common.

Although the circular inspection region has been described as a bolt hole, it should be appreciated that the scanner and method may be used for any such hole, regardless of whether it is intended for use with a bolt or not. Furthermore, other configurations may be used with motors to enable scanning of disk slots, bores, and other complex features.

Figure 9:
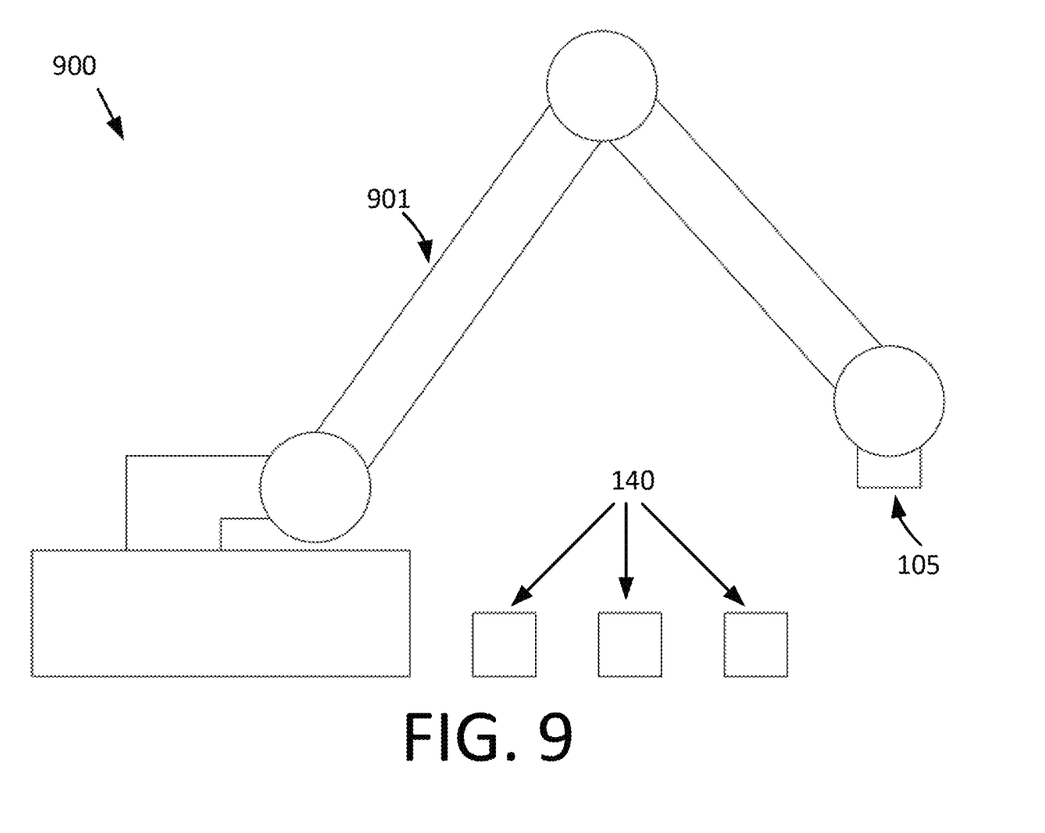
FIG. 9 is a system using a robotic arm and a plurality of integrated sensor cartridges.

FIG. 9 shows system 900, an embodiment of system 100 that further incorporates a robotic arm 901. Robotic arm 901 may be controlled by instrument 110 or in any suitable way. Instrument side connector 105 is incorporated into the distal end of the robotic arm. System 900 may include a plurality of sensor cartridges 140 each configured for a different task. For example, sensor cartridges 140 may include mandrel sensor cartridges of different diameters or different sensor configurations. As another examples, cartridges 140 may each be adapted for a different type engine disk slot geometry or different engine blade geometry. Robotic arm 901 is configured to engage and disengage the rigid connector 143 of any of the plurality of rigid sensor cartridges 140.

Figure 10:
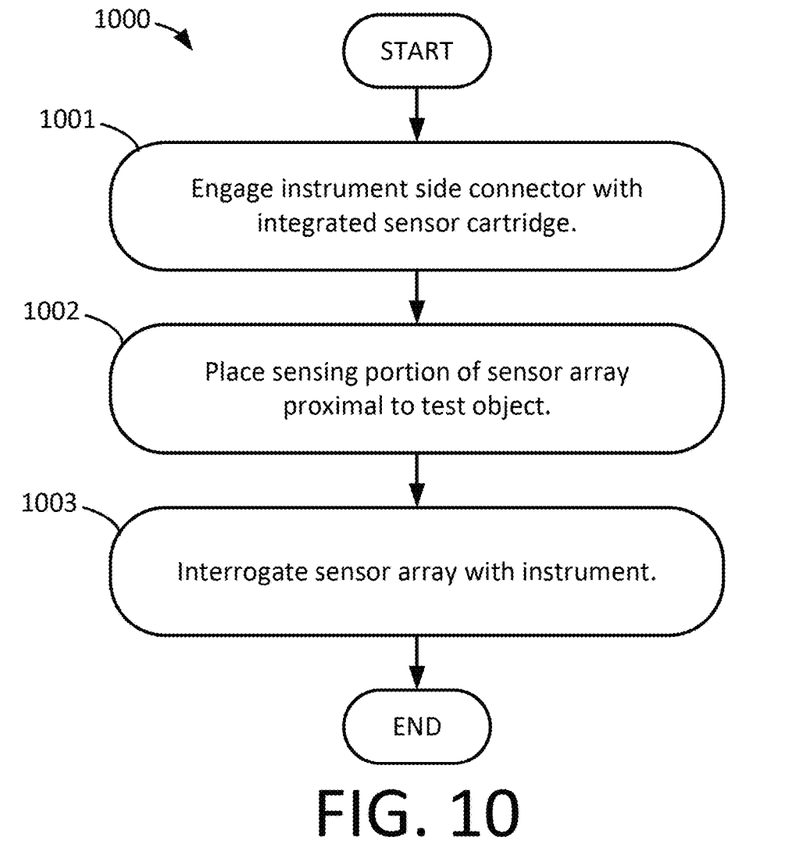
FIG. 10 is a flow diagram of a method for inspecting a test object, according to some embodiments.

FIG. 10 is a flow diagram of method 1000 for inspecting a test object.

At step 1001, an instrument side connector of an instrument is engaged with an integrated sensor cartridge. The integrated sensor cartridge may be similar to sensor cartridge 140 shown, for example, in FIG. 1 and has a mechanical support, a flexible sensor array, and a rigid connector having a mechanical connection and an electrical connection. Advantageously both the mechanical connection and the electrical connection of the integrated sensor cartridge are simultaneously engaged by virtue of the rigid connector of the integrated sensor cartridge and an appropriate mating with the instrument side connector.

At step 1002, the sensor portion of the flexible sensor array is placed proximal to the test object. This may be an automated, semi-automated, or manual process. For example, in an embodiment where the integrated sensor cartridge is an integrated mandrel for bolt hole inspection, a user may insert the integrated mandrel into a bolt hole to be inspected. The system may subsequently use motor controls to finely position the sensing portion of the sensor array within the bolt hole. For example, the sensing portion may be aligned with an edge of the bolt hole.

At step 1003, the instrument interrogates the flexible sensor array so as to take sensor measurements from the sensing elements of the array. The sensor measurements may be processed in any suitable way to enable assessment of the test object. For example, in some embodiments, method 200 and method 1000 are used in combination.

In some embodiments, steps 1002 and 1003 are performed repeatedly so that multiple sensor measurements may be obtained at different sensor positions relative to the test object.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways.

For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

In this respect, it should be appreciated that one implementation of the above-described embodiments comprises at least one computer-readable medium encoded with a computer program (e.g., a plurality of instructions), which, when executed on a processor, performs some or all of the above-discussed functions of these embodiments. As used herein, the term "computer-readable medium" encompasses only a computer-readable medium that can be considered to be a machine or a manufacture (i.e., article of manufacture). A computer-readable medium may be, for example, a tangible medium on which computer-readable information may be encoded or stored, a storage medium on which computer-readable information may be encoded or stored, and/or a non-transitory medium on which computer-readable information may be encoded or stored. Other non-exhaustive examples of computer-readable media include a computer memory (e.g., a ROM, a RAM, a flash memory, or other type of computer memory), a magnetic disc or tape, an optical disc, and/or other types of computer-readable media that can be considered to be a machine or a manufacture.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The integrated connector provides convenient mechanical and electrical connection. In one embodiment the integrated connector with sensor and shuttle form a single unit that can be conveniently connected to the electronics and then used to perform an inspection. In one such embodiment the sensor has three critical components, (i) an upper connection surface that is configured to minimize unmodeled coupling between the drive and sense elements and to align with electrical connections provided by the connector for multiple sensing elements and at least one drive conductor, where the sensor is an eddy current array, (ii) a lead between the upper connection surface and the sensing array, where in one embodiment said lead includes a flux cancelation design, (iii) a sensing array, such as an MWM-Array with linear drive and a linear row of sensing elements for inspecting a part. In one embodiment the sensor described above is mounted onto a mounting platform of a mandrel with the sensing and drive connections properly aligned, where the mounting platform includes a means for mechanical and electrical connection to hold the mandrel in place and secure all necessary electrical connections to drive the MWM-Array drive conductor with a current and sense the voltage on each sensing element. In another such embodiment the mandrel includes a shaft that is approximately the same diameter of the hole to be inspected and the leads of the sensor are drawn down along the shaft during assembly and mounted to the shaft using an adhesive and the sensor is conformed to the end of the shaft for convenient inserting into a hole to be inspected. The use of a mandrel with a shaft is one embodiment, other similar integrated shuttles with integrated connectors are included where the shuttle is shaped to inspect flat surfaces, curved surfaces or otherwise complex or simple surfaces and the integrated connector provides convenient means for connection and enable inspection using a flexible eddy current array.

In one embodiment the material of the mount includes both plastic to reduce interference with the sensor performance and metal to provide rigidity. In other such embodiments, composite materials are used to improve stiffness. In some embodiments, locking mechanisms are included to enable multiple positions of the sensor to be rigidly constrained, including a convenient means such as a release button to allow the operator to rotate or otherwise reposition the sensor relative to the electronics or mounting. This invention includes a means for connecting the mandrel or other shuttle configuration with integrated connector to the electronics, where the mounting mechanism on the electronics accommodates both the mechanical and electrical connections and is sufficiently rigid to provide reliable positioning of the mandrel or shuttle. In one such embodiment the mount on the electronics includes a locking mechanism such as a locking ring, pin or other means to hold the mandrel or shuttle rigidly to the electronics.

What is claimed:

1. An integrated sensor cartridge for connecting electrical and mechanical connections simultaneously, the integrated sensor cartridge comprising:
   a mechanical support;
   a flexible (conformable) sensor array with a plurality of sensing elements, each sensing element having an independent lead, the array including a connecting portion, a lead portion having the leads for each of the sensing elements, and a sensing portion with the plurality of sensing elements, the sensing portion attached to the mechanical support; and
   a rigid connector having a mechanical connection and an electrical connection, and connected to the connecting portion.

2. The cartridge of claim 1, wherein the flexible sensor array is an eddy current array fabricated on a flexible substrate that includes the connecting portion at one end, the lead portion in a middle, and the sensing portion that includes an eddy current sensor construct with a linear drive and a row with the plurality of sensing elements.

3. The cartridge of claim 1, wherein the flexible sensor array is an eddy current array comprising:
   a drive and the plurality of sensing elements in the sensing portion, and
   the lead portion has lead traces including drive lead traces for the drive and sensing element lead traces for each of the plurality of sensing elements, the lead traces arranged such that the most proximal lead traces of each of the plurality of sensing elements is another lead trace for the plurality of sensing elements.

4. The cartridge of claim 3, wherein the sensing element leads traces for each of the plurality of sensing channels comprise flux cancellation leads.

5. The cartridge of claim 1, wherein the mechanical support is in the form of a shuttle shaped to fit an engine disk slot.

6. The cartridge of claim 1, wherein the mechanical support comprises a rigid shuttle and a foam layer 3D printed in a single process, the shuttle being shaped to fit the curvature of a part to be inspected and the foam layer being between the shuttle and the sensing portion and hardness less than Shore 70 A.

7. A sensor system comprising:
   an integrated sensor cartridge having
      a mechanical support,
      a flexible (conformable) sensor array with a plurality of sensing elements, each sensing element having an independent lead, the array including a connecting portion, a lead portion having the leads for each of the sensing elements, and a sensing portion, the sensing portion attached to the mechanical support, and
      a rigid connector having a mechanical connection and an electrical connection, and connected to the connecting portion, the mechanical connection having a ring with a thread; and
   an instrument for measuring a response of the flexible sensor array, the instrument having an instrument side connector configured to mate with the rigid connector of the integrated sensor cartridge, wherein the instrument side connector includes threading to mate with the thread of the ring of the mechanical connection of the rigid connector.

8. The sensor system of claim 7, wherein the mechanical support comprises a joint that locks into at least two different positions.

9. The sensor system of claim 8, where the two different positions are two different angles relative to an axis of the sensor system.

10. The sensor system of claim 7, further comprising a robotic arm, wherein the instrument side connector is located at a distal end of the robotic arm.

11. The sensor system of claim 10, wherein the integrated sensor cartridge is among a plurality of integrated sensor cartridges and the robotic arm is configured to engage and disengage the rigid connector of any of the plurality of integrated sensor cartridges.

12. The sensor system of claim 7, wherein the mechanical support is a mandrel and the sensing portion of the flexible sensor is attached thereto.

13. A method of inspecting a material under test (MUT), the method comprising:
   engaging an instrument side connector with an integrated sensor cartridge having a mechanical support, a flexible (conformable) sensor array with a plurality of sensing elements, each sensing element having an independent lead, and a rigid connector having a mechanical connection and an electrical connection, wherein the flexible sensor array includes a connecting portion, a lead portion having the leads for each of the sensing elements, and a sensing portion, the sensing portion attached to the mechanical support;
   placing the sensing portion of the flexible sensor array proximal to the MUT; and
   interrogating the flexible sensor array with an instrument having the instrument side connector.

14. The method of claim 13, wherein the flexible sensor array is a segmented field array.

15. The method of claim 14, wherein the segmented field array is an eddy current array having at least one drive and at least two inductive sensing elements.

16. The method of claim 14, wherein the segmented field array is dielectrometer having at least one drive electrode and at least two sensing electrodes.

17. The method of claim 14, wherein
   the segmented field array has a circular drive and at least two sensing element arcs at at least two radial distances from the circular drive, and
   the MUT has a coating, and the method further comprises processing data collected by the interrogating step to estimate a thickness of the coating.

18. The method of claim 13, wherein a surface of the MUT is a cylindrical hole, the mechanical support is a mandrel and the placing comprises inserting the mandrel into the cylindrical hole.

19. The method of claim 13, wherein
   the engaging comprises maneuvering the instrument side connector through a robotic arm to which is has been connected to a distal end of, to engage the rigid connector of the integrated sensor cartridge, and
   the placing comprises maneuvering the robotic arm to place the sensing portion of the flexible sensor array proximal to the MUT.

* * * * *